United States Patent
Manian et al.

(10) Patent No.: US 10,236,897 B1
(45) Date of Patent: Mar. 19, 2019

(54) LOSS OF LOCK DETECTOR

(71) Applicant: TEXAS INSTRUMENTS INCORPORATED, Dallas, TX (US)

(72) Inventors: Abishek Manian, Santa Clara, CA (US); Robin Gupta, Santa Clara, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/045,930

(22) Filed: Jul. 26, 2018

(51) Int. Cl.
  *H03L 7/06* (2006.01)
  *H03L 7/095* (2006.01)
  *H04L 7/033* (2006.01)
  *H03L 7/08* (2006.01)

(52) U.S. Cl.
  CPC ............ *H03L 7/095* (2013.01); *H03L 7/0807* (2013.01); *H04L 7/0331* (2013.01)

(58) Field of Classification Search
  USPC .................. 327/147–149, 156–158
  See application file for complete search history.

(56) References Cited

U.S. PATENT DOCUMENTS

| | | | |
|---|---|---|---|
| 3,820,030 A | | 6/1974 | Williams |
| 4,031,466 A | * | 6/1977 | Krause .................... G01P 3/489 324/166 |
| 4,617,520 A | * | 10/1986 | Levine ................. H03K 23/662 327/12 |
| 5,651,035 A | * | 7/1997 | Tozun ................... H03L 7/1806 327/156 |
| 6,188,261 B1 | * | 2/2001 | Nosaka .................... G06F 1/025 327/105 |
| 6,853,696 B1 | | 2/2005 | Moser et al. |
| 7,474,721 B2 | * | 1/2009 | Fredriksson ............. H03K 5/19 375/355 |
| 7,646,225 B2 | * | 1/2010 | Song ....................... H03L 7/085 327/147 |
| 8,300,754 B2 | * | 10/2012 | Nedovic ............... H04J 3/0685 375/354 |

(Continued)

OTHER PUBLICATIONS

"A 39-to-45-Gbit/s Multi-Data-Rate Clock and Data Recovery Circuit With a Robust Lock Detector", Hideyuki Nosaka, et al., IEEE Journal of Solid-State Circuits, vol. 39, No. 8, Aug. 2004, pp. 1361-1365.

(Continued)

*Primary Examiner* — Adam Houston
(74) *Attorney, Agent, or Firm* — John R. Pessetto; Charles A. Brill; Frank D. Cimino

(57) ABSTRACT

A loss of lock detection circuit includes detection circuitry and pulse accumulation circuitry. The detection circuitry includes a first flip-flop, a second flip-flop, and a third flip-flop. The first flip-flop is configured to synchronize a data stream to a first edge of a clock signal. The second flip-flop is configured to synchronize the data stream to a second edge of the clock signal. The third flip-flop is clocked by the data stream, and is configured to store a combined output of the first flip-flop and the second flip-flop at an edge of the data stream. The pulse accumulation circuitry is coupled to the detection circuitry. The pulse accumulation circuitry is configured to collect pulses generated by the third flip-flop.

20 Claims, 4 Drawing Sheets

(56) References Cited

U.S. PATENT DOCUMENTS

| | | | | |
|---|---|---|---|---|
| 8,502,609 B2* | 8/2013 | Kargar | ............... | G01R 23/02 |
| | | | | 327/156 |
| 8,798,223 B2* | 8/2014 | Choudhury | ............. | H04L 7/033 |
| | | | | 375/371 |
| 2002/0057118 A1* | 5/2002 | Tang | ............... | H03L 7/081 |
| | | | | 327/158 |
| 2003/0050027 A1 | 3/2003 | Muhammad et al. | | |
| 2004/0042504 A1* | 3/2004 | Khoury, Jr. | ............... | H04L 7/02 |
| | | | | 370/518 |
| 2005/0047500 A1* | 3/2005 | Gupta | ............... | H03L 7/085 |
| | | | | 375/232 |
| 2007/0090887 A1 | 4/2007 | Seefeldt | | |
| 2009/0147901 A1* | 6/2009 | Do | ............... | H03L 7/113 |
| | | | | 375/375 |
| 2010/0090732 A1 | 4/2010 | Lee | | |
| 2010/0104057 A1 | 4/2010 | Nedovic et al. | | |
| 2010/0241918 A1 | 9/2010 | Nedovic | | |
| 2011/0169535 A1 | 7/2011 | Kyles | | |
| 2015/0146833 A1* | 5/2015 | Byun | ............... | H03L 7/0802 |
| | | | | 375/371 |
| 2016/0028537 A1* | 1/2016 | Erdogan | ............... | H04L 7/033 |
| | | | | 375/374 |
| 2018/0198597 A1* | 7/2018 | Huang | ............... | H04L 7/0016 |

OTHER PUBLICATIONS

International Search Report in corresponding PCT Application No. PCT/US2013/022914 dated May 15, 2013 (3 pages).

* cited by examiner

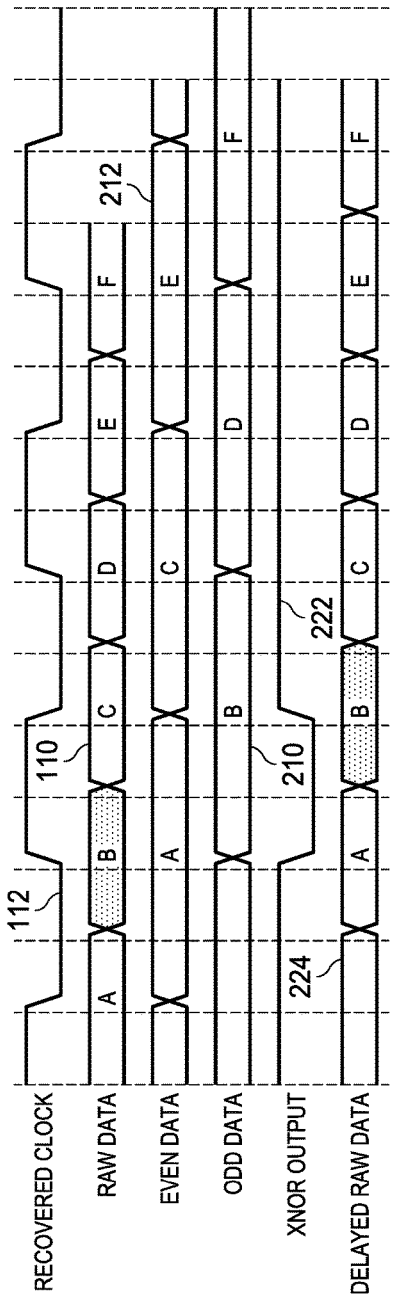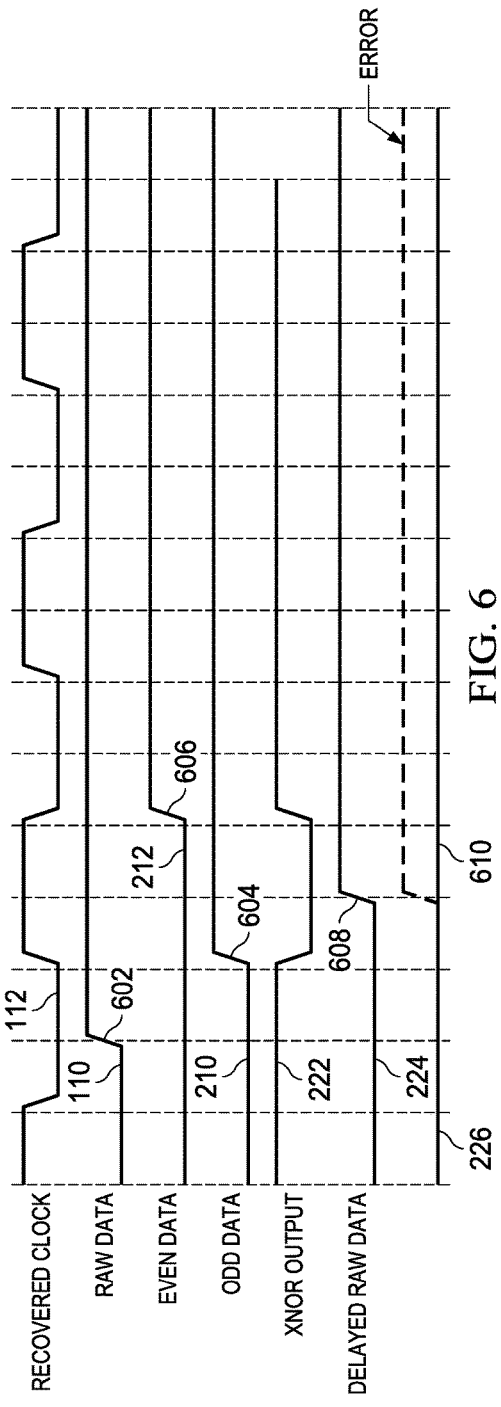
FIG. 5
FIG. 6

LOSS OF LOCK DETECTOR

BACKGROUND

In many communication systems, data is transmitted from one device to another without an accompanying clock signal. During the transmission, the signals carrying the data may become jittery and difficult to decipher and process by the receiving device. Therefore, many systems utilize clock and data recovery (CDR) circuits to retime the incoming signals and transmit the retimed signals to the receiving device. This requires the CDR circuit to generate a clock that locks to the frequency of the transmitted data, in many systems, the CDR circuit detects the frequency of the incoming signals and phase aligns the clock signal to the incoming signals. The incoming signal is then retimed with a clean clock that has been generated by the CDR circuit. The retimed signal then may be output to the receiving device for further processing.

SUMMARY

A loss-of-lock detection circuit for use with a half-rate clock and data recovery circuit is disclosed herein. In one example, a loss of lock detection circuit includes detection circuitry and pulse accumulation circuitry. The detection circuitry includes a first flip-flop, a second flip-flop, and a third flip-flop. The first flip-flop is configured to synchronize a data stream to a first edge of a clock signal. The second flip-flop is configured to synchronize the data stream to a second edge of the clock signal. The third flip-flop is clocked by the data stream, and is configured to store a combined output of the first flip-flop and the second flip-flop at an edge of the data stream. The pulse accumulation circuitry is coupled to the detection circuitry. The pulse accumulation circuitry is configured to collect pulses generated by the third flip-flop.

In another example, a method for detecting loss of lock includes synchronizing a data stream to a rising edge of a clock to produce a first half-rate data stream, and synchronizing the data stream to a falling edge of the clock to produce a second half-rate data stream. The first half-rate data stream and the second half-rate data stream are combined. The combined first half-rate data stream and second half-rate data stream are clocked into a flop-flop. Output pulses of the flip-flop are accumulated to detect loss of lock.

In a further example, a loss of lock detection circuit includes a first flip-flop, a second flip-flop, an exclusive-NOR gate, and a third flip-flop. The first flip-flop includes a data input terminal and an output terminal. The second flip-flop includes a data input terminal and an output terminal. The exclusive-NOR gate includes a first input, a second input, and an output terminal. The first input is coupled to the output terminal of the first flip-flop. The second input is coupled to the output terminal of the second flip-flop. The third flip-flop includes a data input terminal, clock input terminal, and an output terminal. The data input terminal of the third flip-flop is coupled to the output of the exclusive-NOR gate. The clock input terminal of the third flip-flop is coupled to the data input terminal of the first flip-flop and the data input terminal of the second flip-flop.

BRIEF DESCRIPTION OF THE DRAWINGS

For a detailed description of various examples, reference will now be made to the accompanying drawings in which:

FIGS. 5 and 6 show an examples of timing diagrams for operation of a loss-of-lock detection circuit in accordance with the present disclosure.

DETAILED DESCRIPTION

Figure 1:
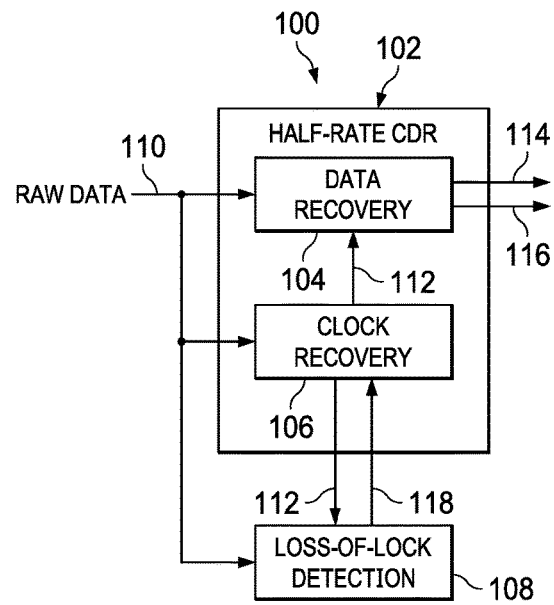
FIG. 1 shows a block diagram for a half-rate clock and data recovery (CDR) system in accordance with the present disclosure.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

Clock and data recovery (CDR) circuits use a phase and frequency detector to recover a clock aligned in frequency and phase to a clock embedded in received data. A frequency acquisition loop includes a frequency detector that acquires a frequency close to the frequency of the embedded clock, and a phase tracking loop includes a phase detector that phase aligns the recovered clock to the frequency aligned embedded clock. In some implementations, the frequency and phase detection are performed in a single loop. The recovered clock is used to generate recovered data from the received data.

In some applications, the CDR circuit includes a reference clock in the frequency acquisition loop, while for other applications, the CDR circuit is reference-less and only the position of the data edges is known. Particularly (but not exclusively) for reference-less CDR circuits, a mechanism for detecting an out-of-lock condition, including false lock, is advantageous. For example, in a CDR circuit, the frequency detector may be turned off after initial frequency acquisition to save power. A loss of lock detection circuit can detect/identify an out of lock condition and enable the CDR to take corrective action, which may include powering up the frequency detector and restarting frequency acquisition.

Loss of lock detection circuits designed for use with full-rate CDR circuits are not suitable for use with half-rate CDR circuits. The loss-of-lock detection circuit disclosed herein detects loss-of-lock and false lock in a half-rate CDR circuit. Implementations of the loss of lock detection circuits of the present disclosure determine whether half-rate retimed data includes a transition corresponding to a transition in the raw data. Missed transitions in the half-rate retimed data may be due to a clock frequency that is lower or higher than half the data rate resulting in missed transitions due to under-sampling or sample/hold time violations. The loss-of-lock detection circuits disclosed herein are suitable, for use with a wide variety half-rate phase/frequency detectors and do not require use of a reference clock.

FIG. 1 shows a block diagram for a half-rate CDR system 100 in accordance with the present disclosure. The half-rate CDR system 100 includes a CDR circuit 102 and a loss-of-lock detection circuit 108. The CDR circuit 102 recovers a clock signal from received data and retimes the received data using the recovered clock signal. The CDR circuit 102 includes data recovery circuitry 104 and clock recovery circuitry 106. The clock recovery circuitry 106 may include a frequency detection circuit and a phase detection circuit to generate a recovered clock signal 112 based on transitions of the raw data stream 110. The frequency and phase of the recovered clock signal 112 align the recovered clock signal 112 with the bit timing of the raw data stream 110. The data recovery circuitry 104 applies the recovered clock signal 112 to retime (i.e., to re-clock) the raw data stream 110. The data recovery circuitry 104 generates two retimed data streams 114 and 116 from the raw data stream 110. Each of the retimed data streams 114 and 116 is at one-half of the bit rate of the raw data stream 110. For example, the retimed data stream 114 includes only odd numbered bits of the raw data stream 110, and the retimed data stream 114 includes only even numbered bits of the raw data stream 110.

The loss-of-lock detection circuit 108 monitors the relationship of the recovered clock signal 112 and the raw data stream 110 to determine whether the recovered clock signal 112 is locked to the raw data stream 110. If the loss-of-lock detection circuit 108 determines that the recovered clock signal 112 is not locked to the raw data stream 110, then the loss-of-lock detection circuit 108 generates a loss-of-lock indicator 118. On receipt of the loss-of-lock indicator 118, the clock recovery circuitry 106 may activate the frequency detection circuit and/or the phase detection circuit to resynchronize the recovered clock signal 112 to the raw data stream 110.

Figure 2:
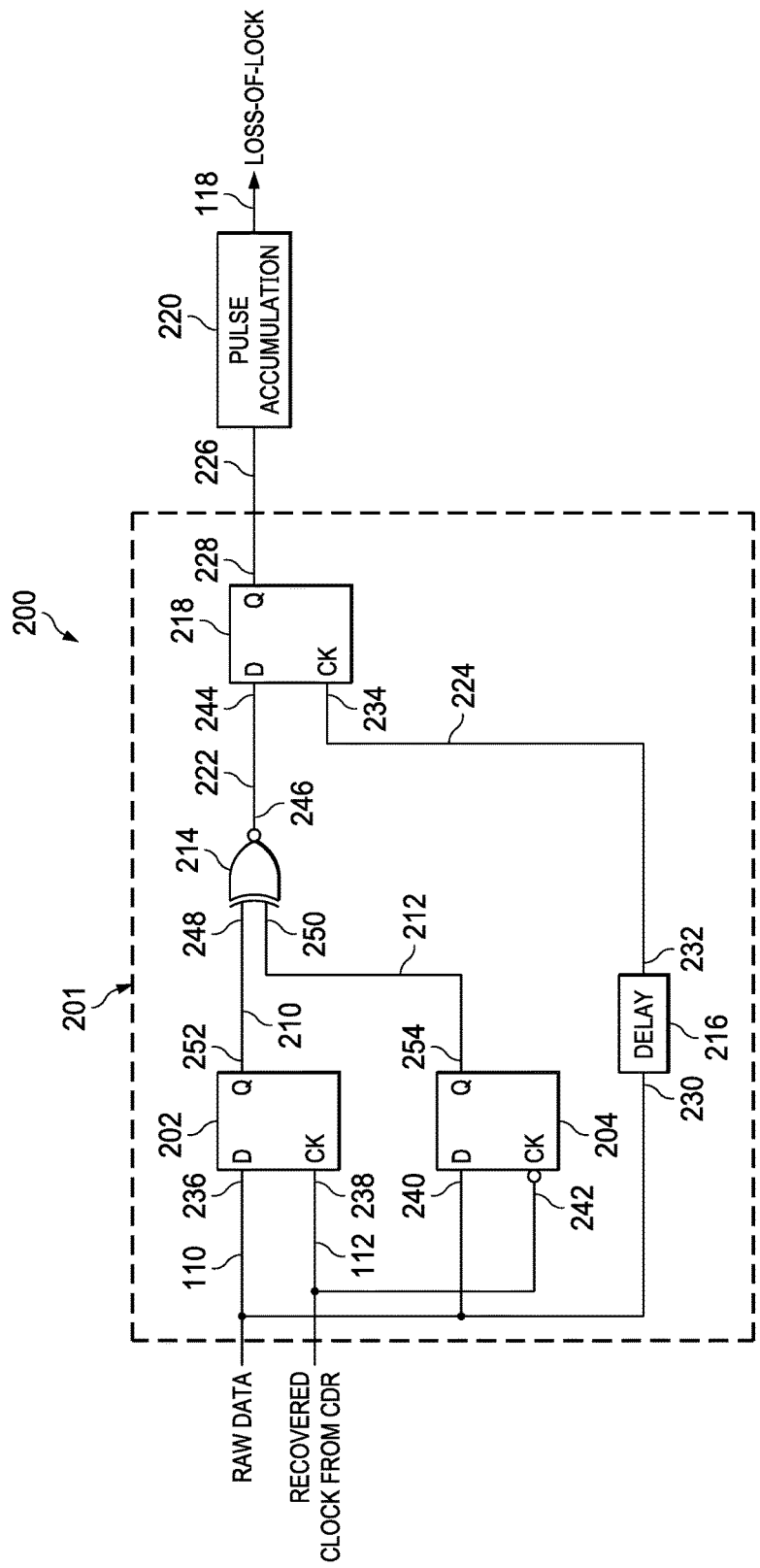
FIG. 2 shows a schematic diagram for an example of a loss-of-lock detection circuit suitable for use with a half-rate CDR circuit in accordance with the present disclosure.

FIG. 2 shows a schematic diagram for an example of a loss-of-lock detection circuit 200 suitable for use in the half-rate CDR system 100. The loss-of-lock detection circuit 200 is an implementation of the 108. The loss-of-lock detection circuit 200 includes detection circuitry 201 and pulse accumulation circuitry 220 that is coupled to the detection circuitry 201. The detection circuitry 201 includes a synchronization flip-flop 202, a synchronization flip-flop 204, an exclusive-NOR gate 214, a delay circuit 216, and a pulse generation flip-flop 218. The raw data stream 110 received from a transmitting data source is clocked in to the synchronization flip-flop 202 and the synchronization flip-flop 204 using the recovered clock signal 112 derived from the raw data stream 110 by the half-rate CDR circuit 102. In some implementations, the synchronization flip-flop 202 and synchronization flip-flop 204 may be incorporated in the half-rate CDR circuit 102 (e.g., in the data recovery circuit 104).

The synchronization flip-flop 202 samples the raw data stream 110 on the rising edge of the recovered clock signal 112 to produce a half-rate data stream 210 containing every other data bit (i.e., odd data bits) of the raw data stream 110. The synchronization flip-flop 202 includes a data input terminal 236, a clock input terminal 238, and an output terminal 252. The data input terminal 236 receives the raw data stream 110. The clock input terminal 238 receives the recovered clock signal 112. The synchronization flip-flop 204 samples the raw data stream 110 on the falling edge of the recovered clock signal 112 to produce a half-rate data stream 212 containing every other data bit (i.e., even data bits) of the raw data stream 110. The synchronization flip-flop 204 includes a data input terminal 240, a clock input terminal 242, and an output terminal 254. The data input terminal 240 receives the raw data stream 110, and is coupled to the data input terminal 236 of the flip-flop 202. The clock input terminal 242 receives the recovered clock signal 112.

The exclusive-NOR gate 214 combines the half-rate data stream 210 and the half-rate data stream 212 to produce a signal 222 that indicates whether the half-rate data stream 210 and the half-rate data stream 212 are the same or different logical values at any time instant. The exclusive-NOR gate 214 includes an input 248, an input 250, and an output 246. The input 248 is coupled to the output terminal 252 of the synchronization flip-flop 202. The input 250 is coupled to the output terminal 254 of the synchronization flip-flop 204. In some implementations, an exclusive-OR circuit, or other circuit that compares to two logic level signals may be used in place of the exclusive-NOR gate 214.

The delay circuit 216 includes circuitry that delays the raw data stream 110 by approximately one bit time of the raw data stream 110 to produce the delayed raw data stream 224. For example, the delay circuit 216 may include one or more buffer circuits (inverting or non-inverting drivers) through which the raw data stream 110 passes to delay the raw data stream 110, where the drivers and the number thereof are selected to produce the approximately one bit time delay. Bit time is shortest time between transitions in the raw data 110. For example, with non-return to zero data the bit time is the inverse of the bit transmission rate (e.g., 1 nanosecond bit time for 1 gigabit per second bit transmission rate). The delay circuit 216 includes an input terminal 230 and an output terminal 232. The input terminal 230 is coupled to the input terminal 236 of the synchronization flip-flop 202 and the input terminal 240 of the synchronization flip-flop 204.

The pulse generation flip-flop 218 samples the signal 222 on a transition (e.g., the rising edge) of the delayed raw data stream 224. Clocking the signal 222 with the delayed raw data stream 224 produces a signal 226 that indicates the synchronization flip-flop 202 or synchronization flip-flop 204 did not transition responsive to a transition in the raw data stream 110. Missed transitions in the half-rate data stream 210 or the half-rate data stream 212 may be caused by under-sampling (i.e., the rate of the recovered clock signal 112 is lower than the rate of the raw data stream 110) or by setup or hold time violations in the synchronization flip-flop 202 or synchronization flip-flop 204, which may be caused by an incorrect rate of the recovered clock signal 112. The signal 226 is provided to the pulse accumulation circuit 220. The pulse generation flip-flop 218 includes a data input terminal 244, a clock input terminal 234, and an output terminal 228. The data input terminal 244 is coupled to the output 246 of the exclusive-NOR gate 214. The clock input terminal 234 is coupled to the output terminal 232 of the delay circuit 216.

In some implementations of the loss-of-lock detection circuit 200 the pulse generation flip-flop 218 includes an edge triggered set or reset input. In such implementations, an inverted version of the delayed raw data stream 224 may be provided to the edged triggered set or reset input so that the pulse generation flip-flop 218 is set or reset on each falling edge of the delayed raw data stream 224. Thus, the pulse generation flip-flop 218 initiates an output pulse on a rising edge of the delayed raw data stream 224 and terminates the output pulse on a subsequent falling edge of the delayed raw data stream 224.

Figure 3:
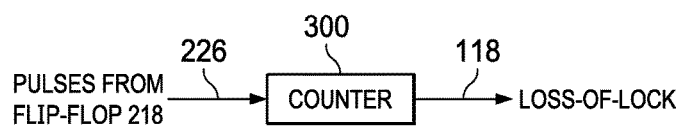
FIGS. 3 and 4 show examples of pulse accumulation circuits suitable for use in a loss-of-lock detection circuit in accordance with the present disclosure.
Figure 4:
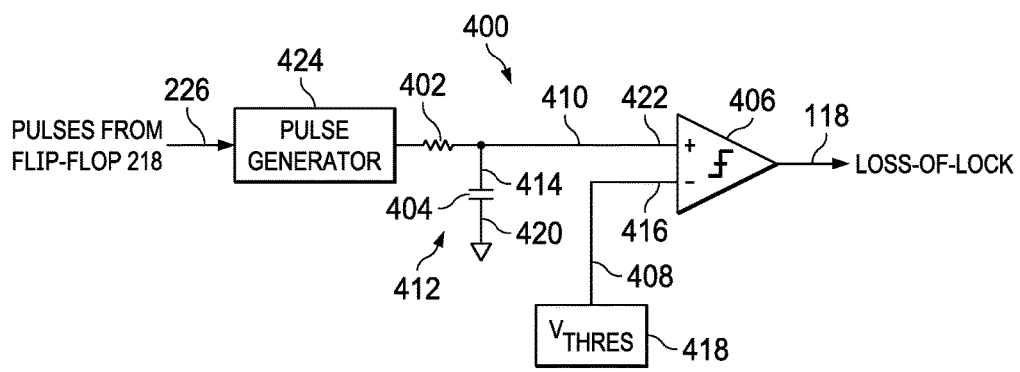

The pulse accumulation circuit 220 is coupled to the output terminal of the pulse generation flip-flop 218. The pulse accumulation circuit 220 collects pulses generated by the pulse generation flip-flop 218, and generates a loss-of-lock indicator 118 based on the signal 226. Some implementations of the pulse accumulation circuit 220 generate the loss-of-lock indicator 118 based on generation of a predetermined number of pulses on the signal 226 in a fixed time interval. FIGS. 3 and 4 show examples of implementations of the pulse accumulation circuit 220. In FIG. 3, a digital counter 300 implements the pulse accumulation circuit 220. A clock input of the digital counter is coupled to the output terminal of the pulse generation flip-flop 218. Pulses provided on the signal 226 increment or decrement the digital counter 300, and when the digital counter 300 is incremented or decremented to a predetermined value, the digital counter 300 generates an output signal indicating that the recovered clock signal 112 has lost lock with the raw data stream 110. In some implementations, the digital counter 300 may be periodically set to a predetermined value (e.g., set to zero) to initialize the digital counter 300 for loss of lock detection.

FIG. 4 shows a pulse accumulation circuit 400, which is another implementation of the pulse accumulation circuit 220. The pulse accumulation circuit 400 includes a comparator 406 and a filter circuit 412. The filter circuit 412 is coupled to the output terminal of the pulse generation flip-flop 218. The filter circuit 412 includes a resistor 402 and a capacitor 404. A first terminal 414 of the capacitor 404 is coupled to the output terminal of the pulse generation flip-flop 218, and a second terminal 420 of the capacitor 404 is connected to ground. Pulses on the signal 226 charge the capacitor 404 so that the voltage 410 across the capacitor 404 increases as a function of the number of pulses on the signal 226. The filter circuit 412 is also coupled to the comparator 406. The first terminal 414 of the capacitor 404 is coupled to an input terminal 422 of the comparator 406. The comparator 406 compares the voltage 410 to a threshold voltage 408. An input terminal 416 of the comparator 406 is coupled to a threshold voltage source 418 that generates the threshold voltage 408. If the voltage 410 exceeds the threshold voltage 408, the comparator 406 drives the loss-of-lock indicator 118 to indicate that the recovered clock signal 112 has lost lock with the raw data stream 110. Implementations of the pulse accumulation circuit 400 may also include circuitry to periodically discharge the capacitor 404 to initialize the pulse accumulation circuit 400 for loss of lock detection. Some implementations of the pulse accumulator circuit 400 may include a pulse generator 424, such as a monostable multivibrator circuit, that generates a pulse of defined width to charge the capacitor 304 responsive to a transition on the signal 226.

FIG. 5 shows an example of a timing diagram for operation of the loss-of-lock detection circuit 200 in accordance with the present disclosure. The raw data stream 110 is sampled by the synchronization flip-flop 202 on the rising edge of the recovered clock signal 112 to capture odd data bits B, D, F, etc. The raw data stream 110 is sampled by the synchronization flip-flop 204 on the falling edge of the recovered clock signal 112 to capture even data bits A, C, E, etc. The exclusive-NOR gate 214 combines the half-rate data stream 210 and the half-rate data stream 212 to generate high or low going pulses when the half-rate data stream 210 and the half-rate data stream 212 are different. The delayed raw data stream 224 clocks the signal 222 into the pulse generation flip-flop 218. If the signal 222 indicates that the half-rate data stream 210 and half-rate data stream 212 are not different at the edge of the delayed raw data stream 224, then the half-rate data streams missed a transition in the raw data stream 110, and signal 226 transitions to indicate the missed transition. The pulse accumulator 220 accumulates the transitions or pulses on the loss-of-lock indicator 118.

FIG. 6 shows an example of a timing diagram for operation of the loss-of-lock detection circuit 200 in which a transition on the raw data stream 110 is illustrated. In FIG. 6, the raw data stream 110 is zero during bit A and one thereafter. At 602, the raw data stream 110 transitions from low to high. At 604, the synchronization flip-flop 202 samples the raw data stream 110 and the half-rate data stream 210 transitions from low to high. The half-rate data stream 212 is low at 604 and the signal 222 output by the exclusive-NOR gate 214 indicates that the half-rate data stream 210 and the half-rate data stream 212 are different. At 608, the delayed raw data stream 224 transitions from low to high and the pulse generation flip-flop 218 samples the signal 222 to set the signal 226. At 610, the signal 226 indicates that a transition was detected in the half-rate data stream 210 and half-rate data stream 212 responsive to the transition in the raw data stream 110 at 602. Thus, the timing of the recovered clock signal 112 produces a transition in the half-rate data stream 210 and half-rate data stream 212 responsive to the transition in the raw data stream 110 at 602. If there was no transition in the half-rate data stream 210 at 604, then the signal 222 would have indicated no difference in the half-rate data stream 210 and half-rate data stream 212, and at 608 the signal 226 would have transitioned to indicate an error.

Figure 7:
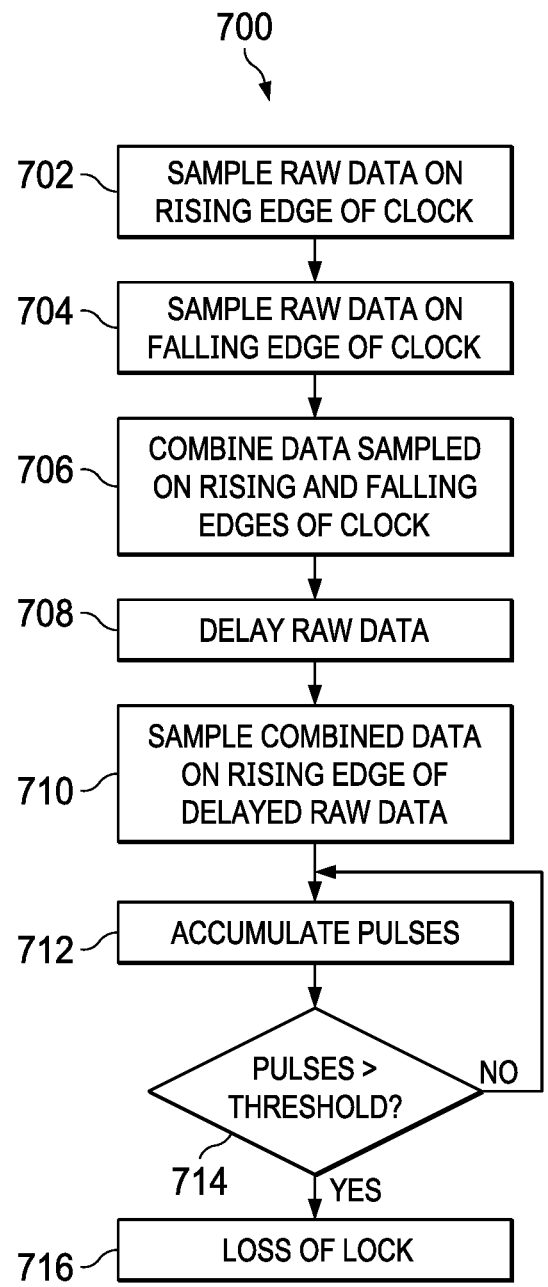
FIG. 7 shows a flow diagram for an example of a method for detecting loss-of-lock in a half-rate CDR circuit in accordance with the present disclosure.

FIG. 7 shows a flow diagram for an example of a method 700 for detecting loss-of-lock in a half-rate CDR circuit in accordance with the present disclosure. Though depicted sequentially as a matter of convenience, at least some of the actions shown can be performed in a different order and/or performed in parallel. Additionally, some implementations may perform only some of the actions shown. Operations of the method 700 may be performed by implementations of the loss-of-lock detection circuit 200. In the method 700, the half-rate CDR circuit 102 is generating the recovered clock signal 112 based on the raw data stream 110.

In block 702, the raw data stream 110 is sampled on and synchronized to the rising edge of the recovered clock signal 112 to produce a half-rate data stream 210. For example, the synchronization flip-flop 202 samples the raw data stream 110 on the rising edge of the recovered clock signal 112.

In block 704, the raw data stream 110 is sampled on and synchronized to the falling edge of the recovered clock signal 112 to produce a half-rate data stream 212. For example, the synchronization flip-flop 204 samples the raw data stream 110 of the falling edge of the recovered clock signal 112.

In block 706, the results of sampling the raw data stream 110 on the rising and falling edges of the recovered clock signal 112 are combined. For example, the exclusive-NOR gate 214 logically combines the half-rate data stream 210 generated by the synchronization flip-flop 202 and the half-rate data stream 212 generated by the synchronization flip-flop 204. Some implementations may apply exclusive-NOR circuitry or other comparison logic to combine the results of sampling the raw data stream 110 on the rising and falling edges of the recovered clock signal 112.

In block 708, the raw data stream 110 is delayed by approximately one bit time. For example, the delay circuit 216 delays the raw data stream 110 by one bit time.

In block 710, the combined rising and falling edge sampled recovered clock signal 112 is sampled (i.e., clocked) on a rising edge of the delayed raw data stream 224. For example, the pulse generation flip-flop 218 samples the signal 222 on the rising edge of the delayed raw data stream 224.

In block 712, the pulses generated by sampling the signal 222 on the rising edge of the delayed raw data stream 224 are accumulated. For example, a counter 300 may count the rising or falling edges occurring in a predetermined time interval, where each rising or falling edge indicates a transition in the raw data stream 110 that was not included (i.e., missed) in the half-rate data stream 210 and half-rate data stream 212.

In block 714, the number of pulses accumulated in block 712 is compared to a threshold value. If the number of pulses accumulated in block 712 exceeds the threshold value, then a loss-of-lock indication is generated. Responsive to the loss-of-lock indication, the CDR circuit 102 may activate circuitry to resynchronize the recovered clock signal 112 to the raw data stream 110. For example, the CDR circuit may activate a frequency detector and/or a phase detector to synchronize the recovered clock signal 112 to the raw data stream 110.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A loss of lock detection circuit, comprising:
   detection circuitry comprising:
   a first flip-flop configured to synchronize a data stream to a first edge of a clock signal;
   a second flip-flop configured to synchronize the data stream to a second edge of the clock signal;
   a third flip-flop clocked by the data stream and configured to store a combined output of the first flip-flop and the second flip-flop at an edge of the data stream; and
   pulse accumulation circuitry coupled to the detection circuitry, the pulse accumulation circuitry configured to collect pulses generated by the third flip-flop.

2. The loss of lock detection circuit of claim 1, further comprising a delay circuit configured to delay the data stream by a bit time of the data stream.

3. The loss of lock detection circuit of claim 2, wherein a clock input of the third flip-flop is coupled to an output of the delay circuit.

4. The loss of lock detection circuit of claim 1, further comprising an exclusive-NOR gate coupled to the first flip-flop, the second flip-flop, and the third flip-flop; wherein the exclusive-NOR gate is configured to combine an output of the first flip-flop with an output of the second flip-flop to produce an input to the third flip-flop.

5. The loss of lock detection circuit of claim 1, wherein the pulse accumulation circuitry comprises a counter configured to count the pulses generated by the third flip-flop.

6. The loss of lock detection circuit of claim 1, wherein the pulse accumulation circuitry comprises a capacitor configured to be charged by the pulses generated by the third flip-flop.

7. The loss of lock detection circuit of claim 1, further comprising a comparator configured to compare a voltage across the capacitor to a threshold voltage.

8. A method for detecting loss of lock, comprising:
   synchronizing a data stream to a rising edge of a clock to produce a first half-rate data stream;
   synchronizing the data stream to a falling edge of the clock to produce a second half-rate data stream;
   combining the first half-rate data stream and the second half-rate data stream;
   clocking the combined first half-rate data stream and second half-rate data stream into a flop-flop; and
   accumulating output pulses of the flip-flop to detect loss of lock.

9. The method of claim 8, further comprising delaying the data stream by a bit time of the data stream to produce a clock that clocks the flip-flop.

10. The method of claim 8, wherein the combining comprises providing the first half-rate data stream and the second half-rate data stream to an exclusive-NOR circuit.

11. The method of claim 8, wherein the accumulating comprises counting pulses generated by the flip-flop.

12. The method of claim 11, further comprising identifying loss of lock by counting a predetermined number of the pulses in a predetermined time interval.

13. The method of claim 8, wherein the accumulating comprises charging a capacitor with pulses generated by the flip-flop.

14. The method of claim 13, further comprising identifying loss of lock by comparing voltage across the capacitor to a threshold voltage.

15. A loss of lock detection circuit, comprising:
    a first flip-flop comprising:
       a data input terminal; and
       an output terminal;
    a second flip-flop comprising:
       a data input terminal coupled to the data input terminal of the first flip-flop; and
       an output terminal;
    an exclusive-NOR gate comprising:
       a first input coupled to the output terminal of the first flip-flop;
       a second input coupled to the output terminal of the second flip-flop; and
       an output terminal;
    a third flip-flop comprising:
       a data input terminal coupled to the output of the exclusive-NOR gate;
       a clock input terminal coupled to the data input terminal of the first flip-flop and the data input terminal of the second flip-flop; and
       an output terminal.

16. The loss of lock detection circuit of claim 15, further comprising a delay circuit comprising:
    an input terminal coupled to the data input terminal of the first flip-flop and the data input terminal of the second flip-flop; and
    an output terminal coupled to the clock input terminal of the third flip-flop.

17. The loss of lock detection circuit of claim 15, further comprising a counter coupled to the output terminal of the third flip-flop.

18. The loss of lock detection circuit of claim 15, further comprising a filter circuit coupled to the output terminal of the third flip-flop.

19. The loss of lock detection circuit of claim 18, wherein the filter circuit comprises a capacitor comprising:

a first terminal coupled to the output terminal of the third flip-flop; and a second terminal coupled to ground.

20. The loss of lock detection circuit of claim 18, wherein the filter circuit comprises a comparator comprising:

a first input terminal coupled to the first terminal of the capacitor; and a second input terminal coupled to a threshold voltage source.

* * * * *